(12) United States Patent
Herder et al.

(10) Patent No.: US 9,169,964 B2
(45) Date of Patent: Oct. 27, 2015

(54) RETENTION MECHANISM AND METHOD FOR REMOVEABLY SUPPORTING A PORTABLE FLIGHT CONTROLLER

(71) Applicant: L-3 Communication Avionics Systems, Inc., Grand Rapids, MI (US)

(72) Inventors: Andrew J. Herder, Caledonia, MI (US); Jadranko Soc, E. Grand Rapids, MI (US)

(73) Assignee: L-3 Communications Avionics Systems, Inc., Grand Rapids, MI (US)

( * ) Notice: Subject to any disclaimer, the term of this patent is extended or adjusted under 35 U.S.C. 154(b) by 263 days.

(21) Appl. No.: 13/770,126

(22) Filed: Feb. 19, 2013

(65) Prior Publication Data

US 2013/0214105 A1 Aug. 22, 2013

Related U.S. Application Data

(60) Provisional application No. 61/601,112, filed on Feb. 21, 2012.

(51) Int. Cl.
| | |
|---|---|
| H05K 7/00 | (2006.01) |
| F16M 13/02 | (2006.01) |
| H05K 5/02 | (2006.01) |
| B64D 45/00 | (2006.01) |

(52) U.S. Cl.
CPC ............. *F16M 13/02* (2013.01); *H05K 5/0204* (2013.01); *B64D 2045/0075* (2013.01)

(58) Field of Classification Search
USPC ................ 200/50.1; 248/544, 651, 681, 27.1; 361/679.41, 679.43, 679.58; 403/321; 439/160
See application file for complete search history.

(56) References Cited

U.S. PATENT DOCUMENTS

| | | | | | |
|---|---|---|---|---|---|
| 2,371,896 | A | * | 3/1945 | Knauer | 248/681 |
| 4,659,159 | A | * | 4/1987 | Takahashi | 439/345 |
| 4,687,172 | A | * | 8/1987 | Stillback | 248/551 |
| 4,991,818 | A | * | 2/1991 | Darbo et al. | 248/681 |

(Continued)

OTHER PUBLICATIONS

International Search Report and Written Opinion of the International Searching Authority from corresponding Patent Cooperation Treaty (PCT) Application No. PCT/US13/26772, mailed Apr. 30, 2013.

(Continued)

*Primary Examiner* — Bradley Duckworth
(74) *Attorney, Agent, or Firm* — Gardner, Linn, Burkhart & Flory, LLP

(57) ABSTRACT

An aircraft electronic device retention mechanism and method of removeably supporting an aircraft electronic device having first electrical contacts within a cockpit having compatible second electrical contacts includes a base that is generally configured to the size and shape of a surface of the electronic device and at least one lever that is mounted by a pivot to the base. The lever(s) has an engaging portion that is adapted to engage an engaged portion of the electronic device and an actuation portion. The actuation portion is adapted to rotate the lever(s) about said pivot between a first orientation in which the engaging portion retains the engaged portion and a second orientation in which the engaging portion does not retain said engaged portion. A manual actuator is connected with the actuation portion of the pivot. The manual actuator is configured to move between a first position, which rotates the lever(s) to the second orientation and a first position which rotates the lever(s) to the first orientation to retain the electronic device.

24 Claims, 11 Drawing Sheets

(56) References Cited

U.S. PATENT DOCUMENTS

| | | | |
|---|---|---|---|
| 5,205,502 A * | 4/1993 | Hill et al. | 244/1 R |
| 5,348,268 A * | 9/1994 | Klein | 248/681 |
| 5,544,010 A * | 8/1996 | Schultz et al. | 361/679.41 |
| 5,564,668 A | 10/1996 | Crowe, II | |
| 5,690,311 A * | 11/1997 | Leighton et al. | 248/681 |
| 5,882,220 A * | 3/1999 | Horii et al. | 439/297 |
| 5,946,186 A | 8/1999 | Karl et al. | |
| 6,029,940 A * | 2/2000 | Klein | 248/346.04 |
| 6,252,514 B1 * | 6/2001 | Nolan et al. | 340/686.4 |
| 6,252,765 B1 * | 6/2001 | Balzaretti et al. | 361/679.42 |
| 7,974,662 B2 * | 7/2011 | Tsai et al. | 455/575.1 |
| 7,978,466 B2 * | 7/2011 | Lewandowski et al. | 361/679.41 |
| 8,215,583 B2 | 7/2012 | Groomes et al. | |
| 8,360,370 B2 * | 1/2013 | Probasco et al. | 248/27.3 |
| 8,430,103 B2 * | 4/2013 | Wei et al. | 128/897 |
| 8,448,914 B2 * | 5/2013 | Roehr et al. | 248/689 |
| 8,498,120 B2 * | 7/2013 | Chen | 361/726 |
| 8,526,191 B2 * | 9/2013 | Peng et al. | 361/756 |
| 8,649,175 B2 * | 2/2014 | Liu et al. | 361/679.58 |
| 8,780,553 B2 * | 7/2014 | Palmer et al. | 361/679.57 |
| 8,807,488 B2 * | 8/2014 | Lee et al. | 248/27.1 |
| 2003/0155471 A1 * | 8/2003 | Dean et al. | 248/27.1 |
| 2003/0209639 A1 * | 11/2003 | Tuttle et al. | 248/27.1 |
| 2006/0166533 A1 * | 7/2006 | Muramatsu et al. | 439/160 |
| 2008/0002354 A1 * | 1/2008 | Carnevali | 361/686 |
| 2008/0166896 A1 * | 7/2008 | Choi et al. | 439/43 |
| 2010/0072323 A1 | 3/2010 | Groomes et al. | |
| 2011/0141685 A1 * | 6/2011 | Hung et al. | 361/679.43 |
| 2011/0273838 A1 * | 11/2011 | Lin et al. | 361/679.41 |
| 2012/0087084 A1 * | 4/2012 | Nguyen et al. | 361/679.37 |
| 2013/0032687 A1 * | 2/2013 | Zhang et al. | 248/544 |

OTHER PUBLICATIONS

International Preliminary Report on Patentability from corresponding Patent Cooperation Treaty Patent Application No. PCT/US2013/026772 mailed Sep. 4, 2014.

* cited by examiner

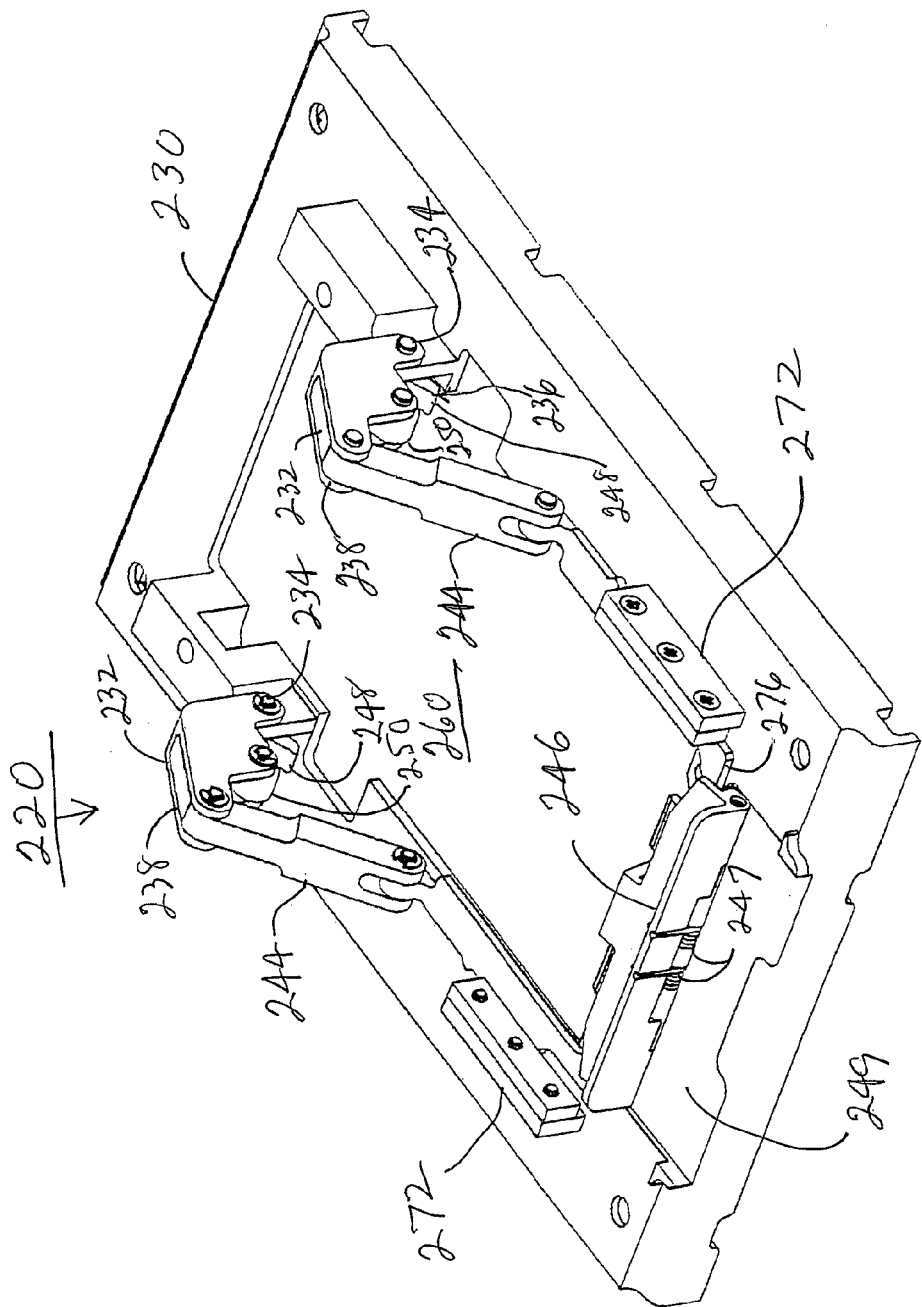

US 9,169,964 B2

RETENTION MECHANISM AND METHOD FOR REMOVEABLY SUPPORTING A PORTABLE FLIGHT CONTROLLER

CROSS REFERENCE TO RELATED APPLICATION

This application claims priority from U.S. provisional patent application Ser. No. 61/601,112, filed on Feb. 21, 2012, the disclosure of which is hereby incorporated herein by reference in its entirety.

BACKGROUND OF THE INVENTION

The present invention is directed to a retention mechanism and method for removeably supporting an electronic device in a vehicle, such as an aircraft. While the invention is illustrated for use with a portable flight controller that is adapted to control and configure a primary flight display in a cockpit of the aircraft, it is useful with other portable devices having touchscreen displays and other portable electronic devices in general.

Flight controllers are displayed and input devices are mounted in the cockpit of an aircraft. It has been proposed that the flight controller be made portable so that it can be easily removed from the aircraft to be upgraded or moved to other aircraft, and the like. Such portable flight controller has a set of electrical contacts, such as in the form of an electrical connector that engages a set of compatible electrical contacts of the cockpit. Because of the large number of contacts that electrically connect the portable flight controller to the cockpit, the force needed to join and to separate the electrical contacts may be very large, such as up to 35 pounds of force or more.

SUMMARY OF THE INVENTION

The present invention provides an electronic device retention mechanism and method of removeably supporting an aircraft electronic device that is capable of securely mounting an electronic device, such as a portable flight controller, in a vehicle, such as an aircraft, while withstanding the vibration associated with operation of the vehicle. Also, the electronic device retention mechanism and method of removeably supporting an aircraft electronic device provided herein is capable of overcoming the force necessary to engage and disengage complimentary electrical contacts in order to mount or to remove the electronic device. Furthermore, this may be accomplished without the need for tools.

An aircraft electronic device retention mechanism and method of removeably supporting an aircraft electronic device within a cockpit, according to an aspect of the invention, includes a base that is generally configured to the size and shape of a surface of the electronic device and at least one lever that is mounted by a pivot to the base. The lever(s) have an engaging portion on one side of the pivot that is adapted to engage an engaged portion of the electronic device and an actuation portion on an opposite side of the pivot. The actuation portion is adapted to rotate the lever(s) about said pivot between a first orientation in which the engaging portion retains the engaged portion and a second orientation in which the engaging portion does not retain said engaged portion. A manual actuator is connected with the actuation portion of the pivot. The manual actuator is configured to move between a first position, which rotates the lever(s) to the first orientation, and a second position, which rotates the lever(s) to the second orientation.

The manual actuator may have another engaging portion that is adapted to engage another engaged portion of the electronic device when the manual actuator is in its first position in order to provide a second area of retention of the electronic device. The another engaging portion does not engage the another engaged portion when the actuator is in said second position. This allows the electronic device to be removed. The manual actuator may be configured to linear motion between its first and second positions.

A link may connect the manual actuator and the lever(s). The link is adapted to translate linear motion of the manual actuator to rotational motion of one of the lever(s). A user grasp area may be configured for engagement by a user to the manual actuator between the first and second positions. The manual actuator may have a tongue or groove that engages the groove or tongue on the electronic device.

The pivot may be closer to the engaging portion of the lever(s) than to the actuation portion. In this manner, the force applied to the engaged portion may be greater than force applied to the actuation portion. The engaging portion may include a first extension that is adapted to pull the engaged portion into engagement with the base as the lever(s) pivot between the second orientation and the first orientation. The engaging portion may include a second extension that is adapted to push the engaged portion away from the base as the lever(s) pivots between the first orientation and the second orientation. The engaged portion may include a protrusion of the electronic device that is positioned between the first and second extensions. In this manner, the first extension moves the protrusion in one direction as the lever(s) pivots from the second orientation to the first orientation. The second extension moves the protrusion in an opposite direction as the lever(s) pivots from the first orientation to the second orientation. The second extension may be a roller to reduce friction.

The base may have a first surface that is adapted to interface with the surface of the electronic device and a second surface that is opposite the first surface and at least one opening between the first and second surfaces. The lever(s) and the manual actuator are at the second surface and engage the engaged portion and the another engaged portion, respectively, passing through the opening(s). The electronic device may have first electrical contacts and the cockpit second electrical contacts. The engaged portion of the electronic device may be at the first electrical contacts and the lever(s) positioned where the first electrical contacts pass through the opening(s).

An aircraft electronic device retention mechanism and method of removeably supporting an aircraft electronic device within a cockpit, according to another aspect of the invention, includes a base that is generally configured to the size and shape of a surface of the electronic device and at least two levers that are each mounted by a pivot to said base. The levers each have an engaging portion on one side of the pivot that is adapted to engage an engaged portion of the electronic device and an actuation portion on an opposite side of said pivot. The actuation portion is adapted to rotate the lever about the pivot between a first orientation in which the engaging portion retains the engaged portion and a second orientation in which the engaging portion does not retain the engaged portion. A manual actuator includes at least two elongated members and at least two links. Each link is between one of the elongated members and one of the levers. The links are adapted to translate linear motion of the manual actuator to rotational motion of the at least two levers. The manual actuator is configured to move between a first position and second position. Movement to the first position rotates the levers to the first orientation. Movement to the second position rotates the levers to the second orientation. The manual actuator is adapted to retain another portion of the electronic device when in the first position and not retain the another portion when in the second position.

These and other objects, advantages and features of this invention will become apparent upon review of the following specification in conjunction with the drawings.

BRIEF DESCRIPTION OF THE DRAWINGS

FIG. 17 is a perspective view of another alternative embodiment of an aircraft electronic display retention mechanism.

DESCRIPTION OF THE PREFERRED EMBODIMENT

Figure 1:
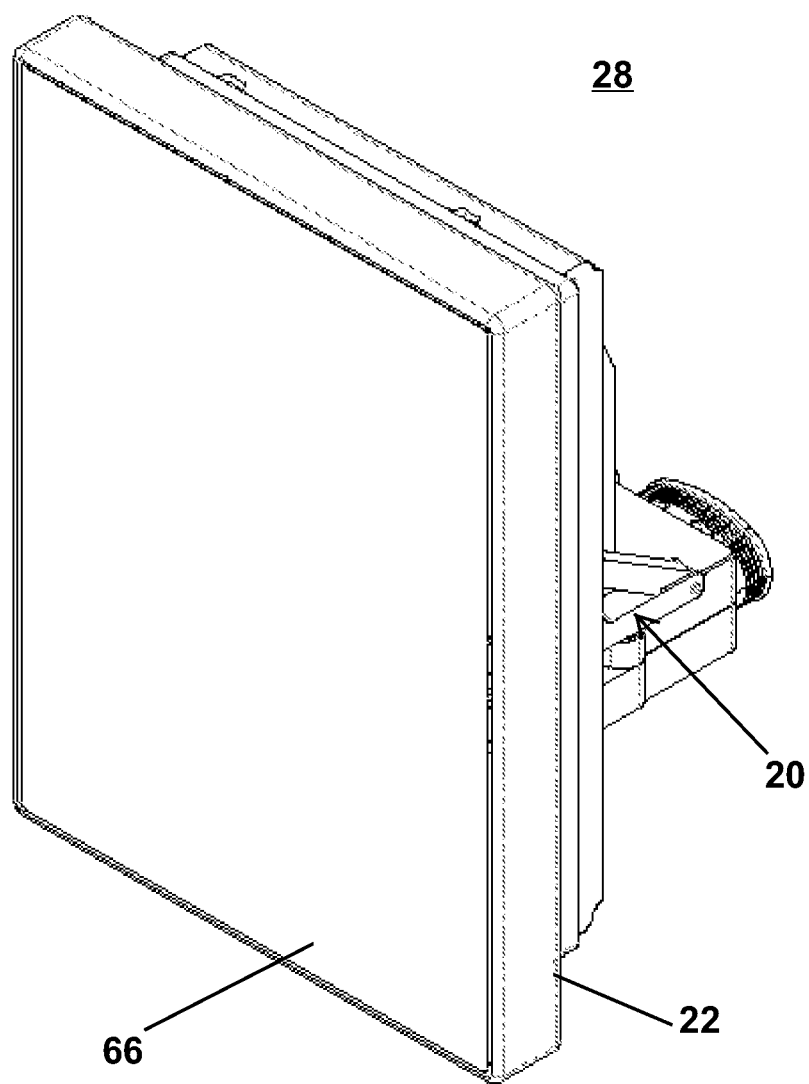
FIG. 1 is a perspective view taken from the front and side of an aircraft electronic display device retained in an aircraft cockpit by a retention mechanism, according to an embodiment of the invention.
Figure 2:
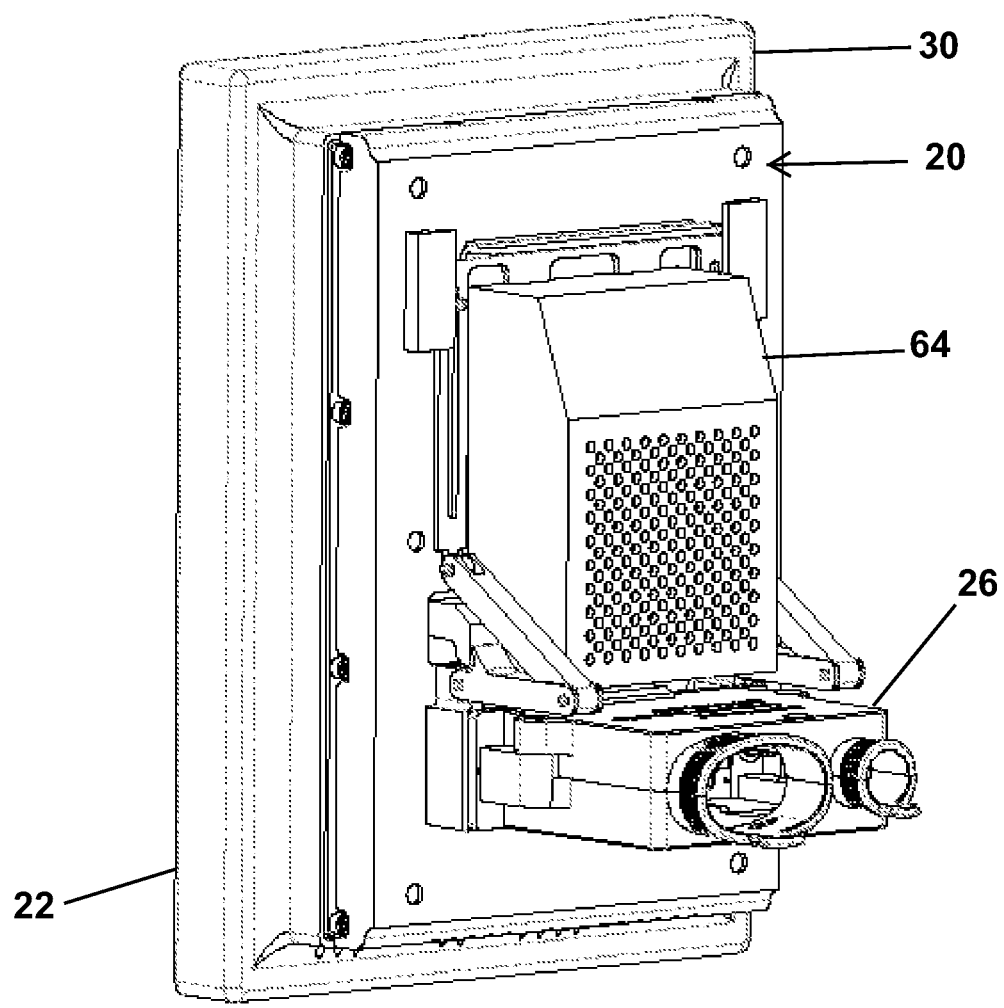
FIG. 2 is a perspective view taken from the rear and side of the aircraft electronic display device and retention mechanism in FIG. 1.
Figure 3:
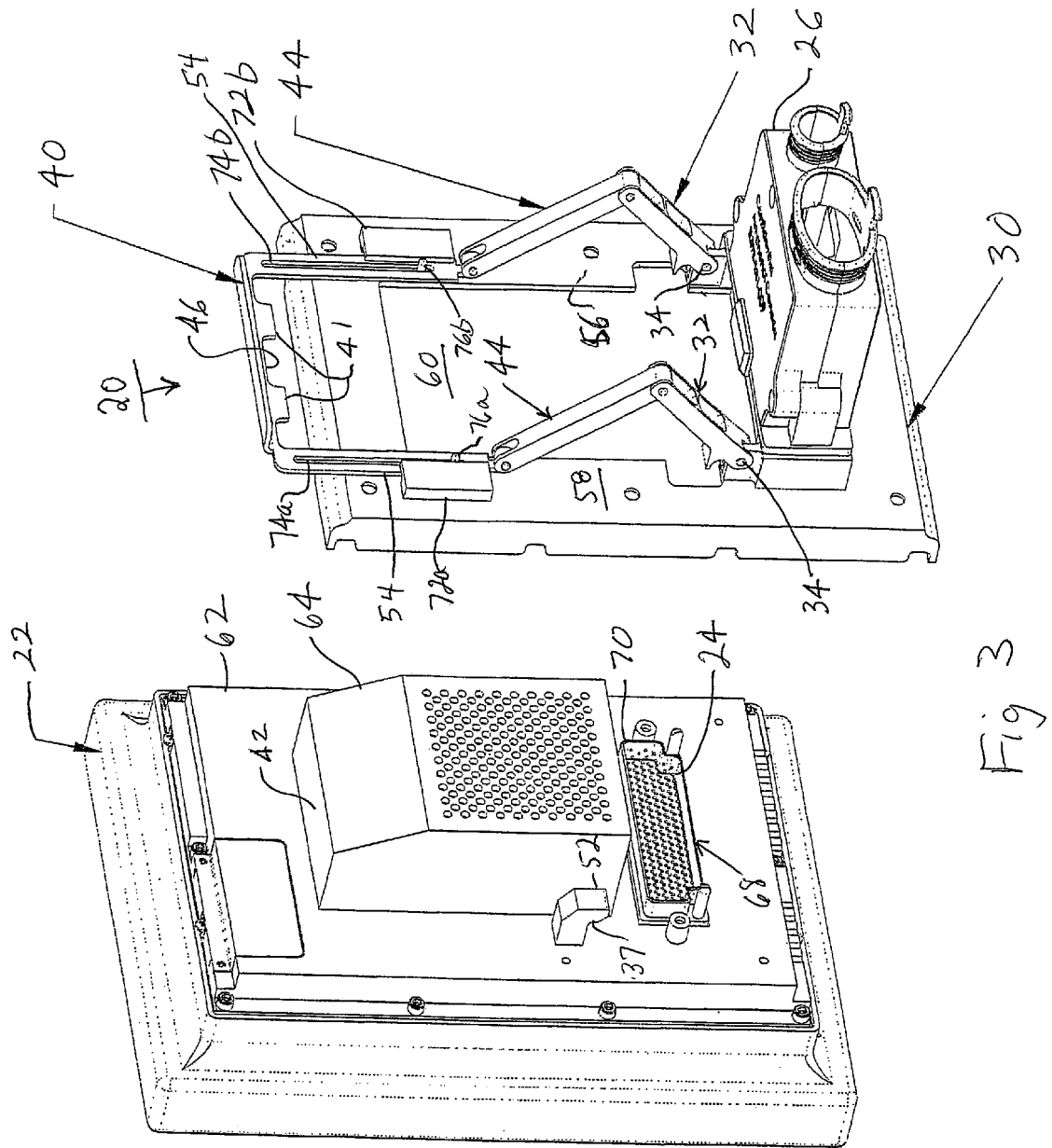
FIG. 3 is the same view as FIG. 2 showing the aircraft electronic display device separate from the retention mechanism.

Referring now to the drawings and the illustrative embodiment depicted therein, an aircraft electronic device retention mechanism 20 is provided that is adapted to removeably support an electronic device, such as an electronic touchscreen display device 22, having first electrical contacts 24 within a cockpit, generally shown at 28 having compatible second electrical contacts 26 (FIGS. 1-13). Electronic device retention mechanism 20 includes a base or cradle or tray 30 that is generally configured to the size and shape of a surface of the electronic device 22. Electronic device 22, which forms no part of the present invention, may include a touchscreen 66 and a housing 62 with an extended box-shaped portion 64, which surrounds a fan, power electronics, and the like (not shown). Base 30 has a first surface 56 that conforms to the shape of housing 62 and a second surface 58 that is opposite surface 56. One or more openings 60 in base 30 receive housing box 64 and an electrical connector 68 having a shell 70 surrounding first electrical contacts 24 when device 22 is positioned in base 30 against first surface 56. In the illustrated embodiment, electronic device 22 is illustrated as a portable flight controller that is used to control and configure a primary flight display (not shown). However, retention mechanism 20 could be used to retain a different type of electronic device having a touchscreen or even an electronic device not having a touchscreen.

Figure 4C:
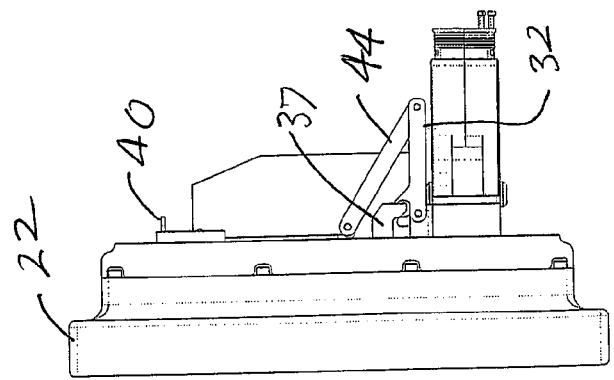
FIGS. 4a-4c are a side elevation of the aircraft electronic display device and retention mechanism showing the retention mechanism in various positions.
Figure 4B:
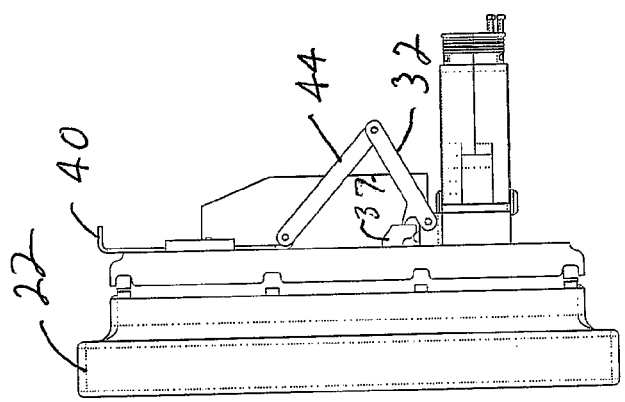
Figure 4A:
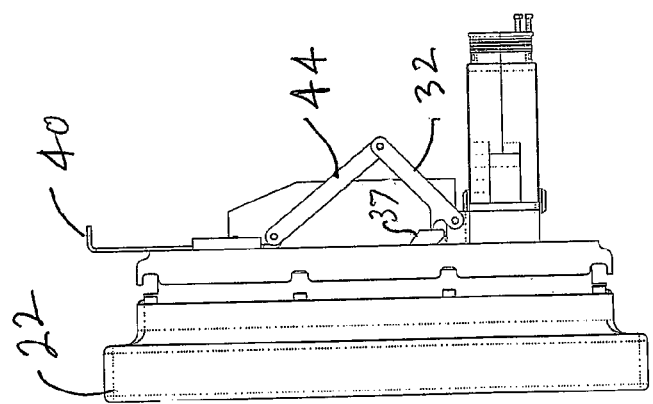
Figure 7:
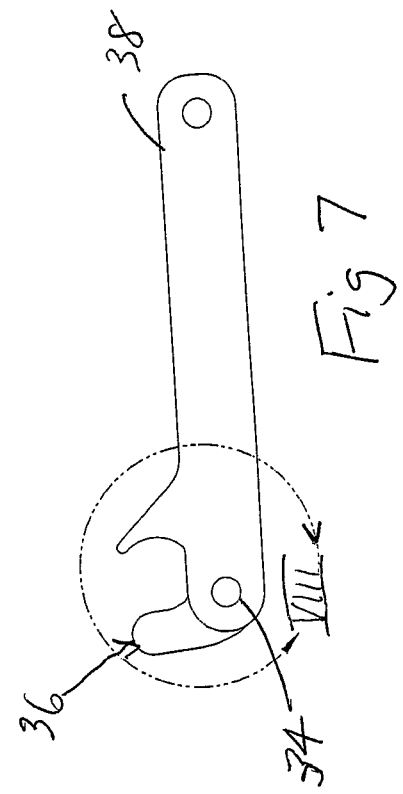
FIG. 7 is a side elevation of the lever in FIG. 5.
Figure 5:
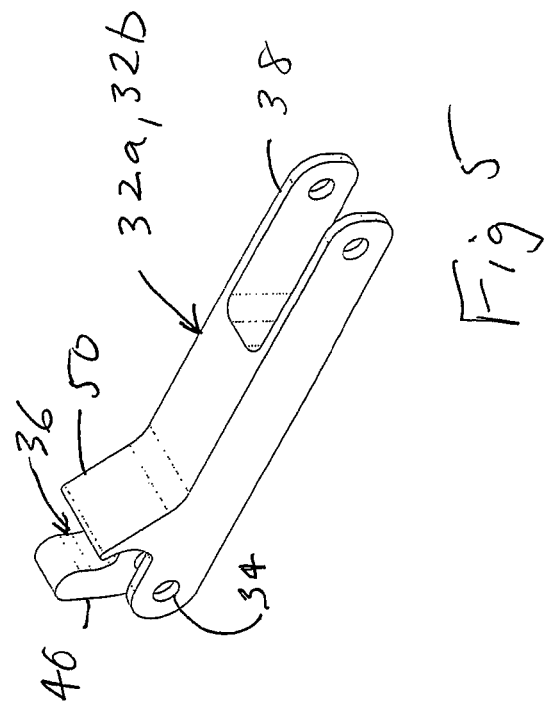
FIG. 5 is a perspective view taken from the side and bottom of a lever.
Figure 8:
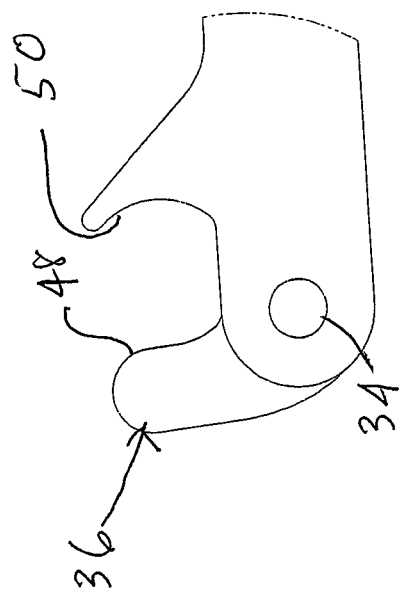
FIG. 8 is an enlargement of the area designated VIII in FIG. 7.
Figure 6:
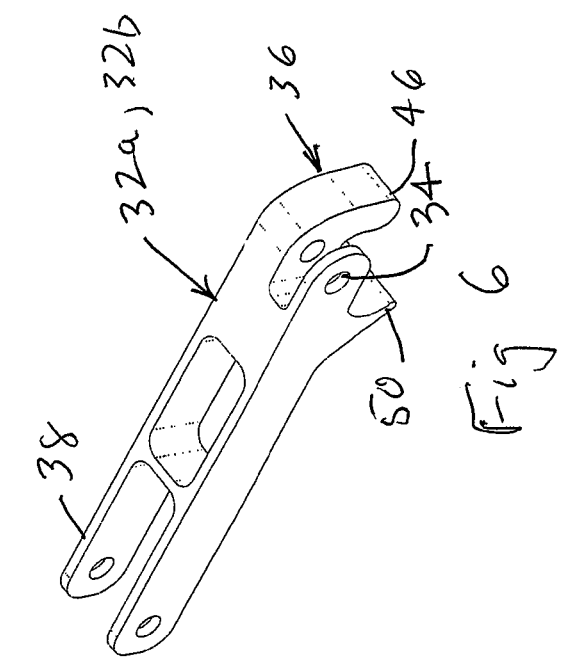
FIG. 6 is a perspective view taken from the side and top of the lever in FIG. 5.
Figure 9:
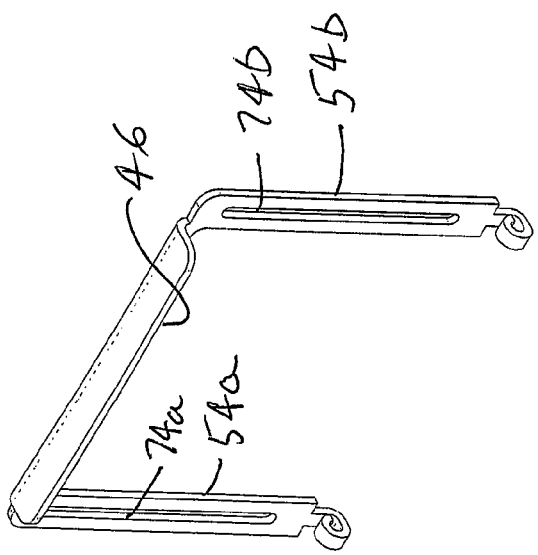
FIG. 9 is a perspective view of a manual actuator.
Figure 11:
FIG. 11 is a side elevation view of the manual actuator in FIG. 9.
Figure 10:
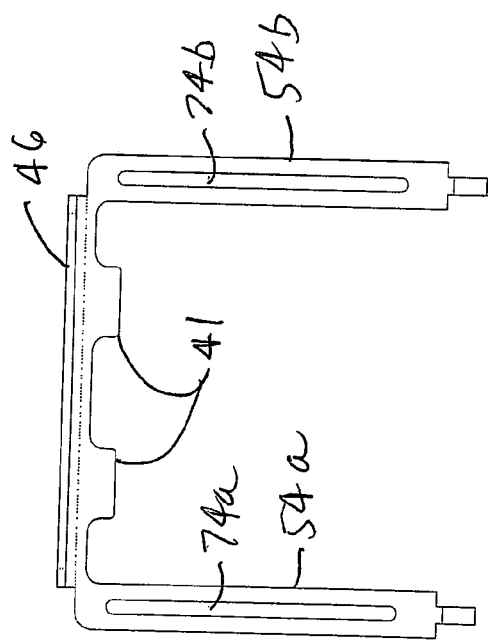
FIG. 10 is a rear elevation view of the manual actuator in FIG. 9.
Figure 12:
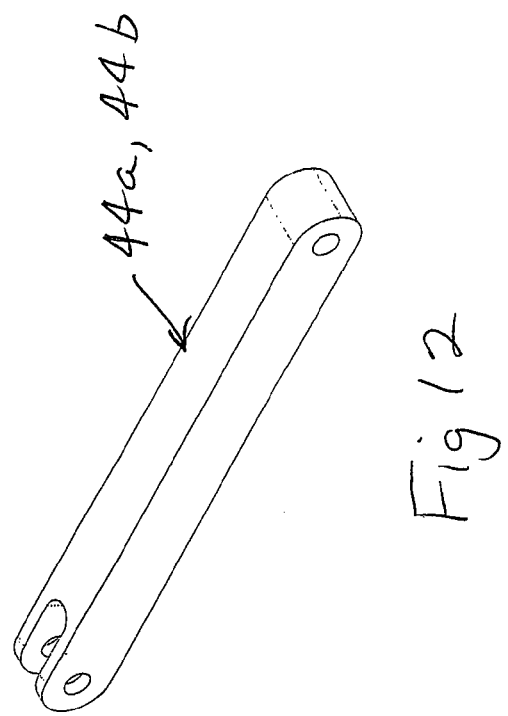
FIG. 12 is a perspective view of a link.
Figure 13:
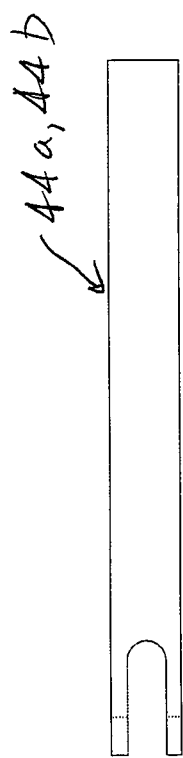
FIG. 13 is a top plan view of the link in FIG. 12.

One or more levers 32 are each mounted by a pivot 34 to base 30. Two such levers are illustrated on opposite sides of opening 60. Each lever 32 is pivotally mounted to base 30 at a pivot 34 and has an engaging portion 36 on one side of pivot 34 that is configured to engage and retain an engaged portion 37 of electronic device 22. Each lever 32 also has an actuation portion 38 on an opposite side of pivot 34 that is configured to rotate the respective lever 32 about its pivot 34 between a first orientation and a second orientation. In the first orientation, in which the portion of lever 32 adjacent pivot 34 is generally horizontal, such as illustrated in FIG. 4c, engaging portion 36 retains engaged portion 37. In an intermediate orientation, in which the portion of lever 32 adjacent pivot 37 slopes more upwardly, as shown in FIG. 4b, engaging portion 36 begins to disengage from engaged portion 37. In the second orientation shown in FIG. 4a, in which the portion of lever 32 adjacent pivot 34 is at its maximum upward slope, engaging portion 36 does not retain engaged portion 37. Electronic device 22 is free of retention mechanism 20.

Retention mechanism 20 also includes a manual actuator 40. Manual actuator 40 is connected with actuation portion 38 of each lever 32 in a manner that as manual actuator 40 moves in a linear motion between a second, raised, position illustrated in FIG. 4a and a first, lowered, position illustrated in FIG. 4c, it rotates levers 32. In particular, manual actuator 40 rotates each lever 32 to its first, generally horizontal, orientation illustrated in FIG. 4c when the manual actuator is moved to its first position and rotates each lever 32 to its second, more upward sloping orientation illustrated in FIG. 4a when manual actuator 40 is moved to its second elevated position. Manual actuator 40 has two parallel elongated members 54 that guide its linear motion by engaging guide blocks 72. Each elongated member 54 is limited in its range of travel by a slot 74 engaged by stationary pins 76.

In addition to rotating levers 32, manual actuator 40 provides a second point of retention of electronic device 22. In particular, manual actuator 40 has an engaging portion 41 that engages an engaged portion 42 of electronic device 22 to further retain the electronic device to base 30. In the illustrated embodiment, engaging portion 41 and engaged portion 42 form a tongue and groove joint, but other configurations are possible. Manual actuator 40 is generally in the shape of a horseshoe with the two elongated members 54 joined with levers 32 by respective links 44. Links 44 translate the linear movement of manual actuator 40 to the rotary motion of levers 32. Manual actuator 40 further includes a user grasp area 46 between elongated members 54 that is configured for engagement by a user to move the manual actuator between the first and second positions.

For each lever 32, pivot 34 is closer to engaging portion 36 than to actuation portion 38. In this manner, mechanical leverage is attained, and force applied to engaged portion 37 is greater than force applied to actuation portion 38. Engaging portion 36 includes a first extension 48 that is configured to pull engaged portion 37 into engagement with base 30 as levers 32 pivot between the second, more vertical, orientation and said first, generally horizontal, orientation. Engaging portion 36 includes a second extension 50 that is configured to push engaged portion 37 away from base 30 as levers 32 pivot between the first, generally horizontal, orientation and the second, more vertical, orientation. Engaged portion 37 of the electronic display device includes a protrusion 52 that is adjacent shell 70 of the connector that includes first electrical contacts 24. When engaged by engaging portion 36 of lever 32, protrusion 52 is positioned between first and second extensions 48, 50 such that first extension 48 moves protrusion 52 in one direction as lever 32 pivots from the second orientation to the first orientation and second extension 50 moves protrusion 52 in an opposite direction as lever 32 pivots from the first orientation to the second orientation. Thus, levers 32 latch engaged portion 37 to base 30 and pull electrical contacts 24, 26 together as levers 32 are rotated to the generally horizontal orientation illustrated in FIG. 4c. Levers 32 also provide leveraged force pushing the electrical contacts 24, 26 apart as levers 32 are rotated to a more vertical orientation illustrated in FIG. 4a. This assists in producing the large force needed to connect and disconnect electrical contacts 24, 26, which may require as great as 30 pounds of force, as an example.

Thus, it can be seen that in order to retain electronic display device 22, the device 22 is positioned against base 30 with manual actuator 40 in its raised position. Manual actuator is then moved manually by linear motion from its second, raised, position to its first, lowered, position. As links 44 translate the linear movement of manual actuator 40 to a rotational motion, levers 32 are rotated from their second, more vertical, orientation to their first, generally horizontal, orientation thereby retaining the engaged portion 37 of electronic display device 22. At the same time, the linear motion of manual actuator 40 causes engaging portion 41 of manual actuator 40 to move into engagement of engaging portion 42 of electronic device 22 to retain another portion of the electronic device. This provides multiple spaced apart retention of electronic device 22. Moreover, the rotation of levers 32 pulls engaged portion 37 with first extension 48 into engagement with base 30 thereby providing the force to cause engagement of electrical contacts 24, 26.

Electronic device 22 may be removed from base 30 by manually moving manual actuator 40 from its lowered position to its raised position. This separates engaging portion 41 of actuator 40 from engaged portion 42 of the electronic device and rotating levers 32 from their generally horizontal orientation to their more vertical orientation. This causes engaging portion 36 of levers 32 to not retain engaged portion 37 of the electronic device. The rotation of levers 32 also causes second extension 50 to push against protrusion 52 thereby providing leveraged force to separate electrical contacts 24, 26. Electronic display device 22 can then be removed from base 30.

Figure 14:
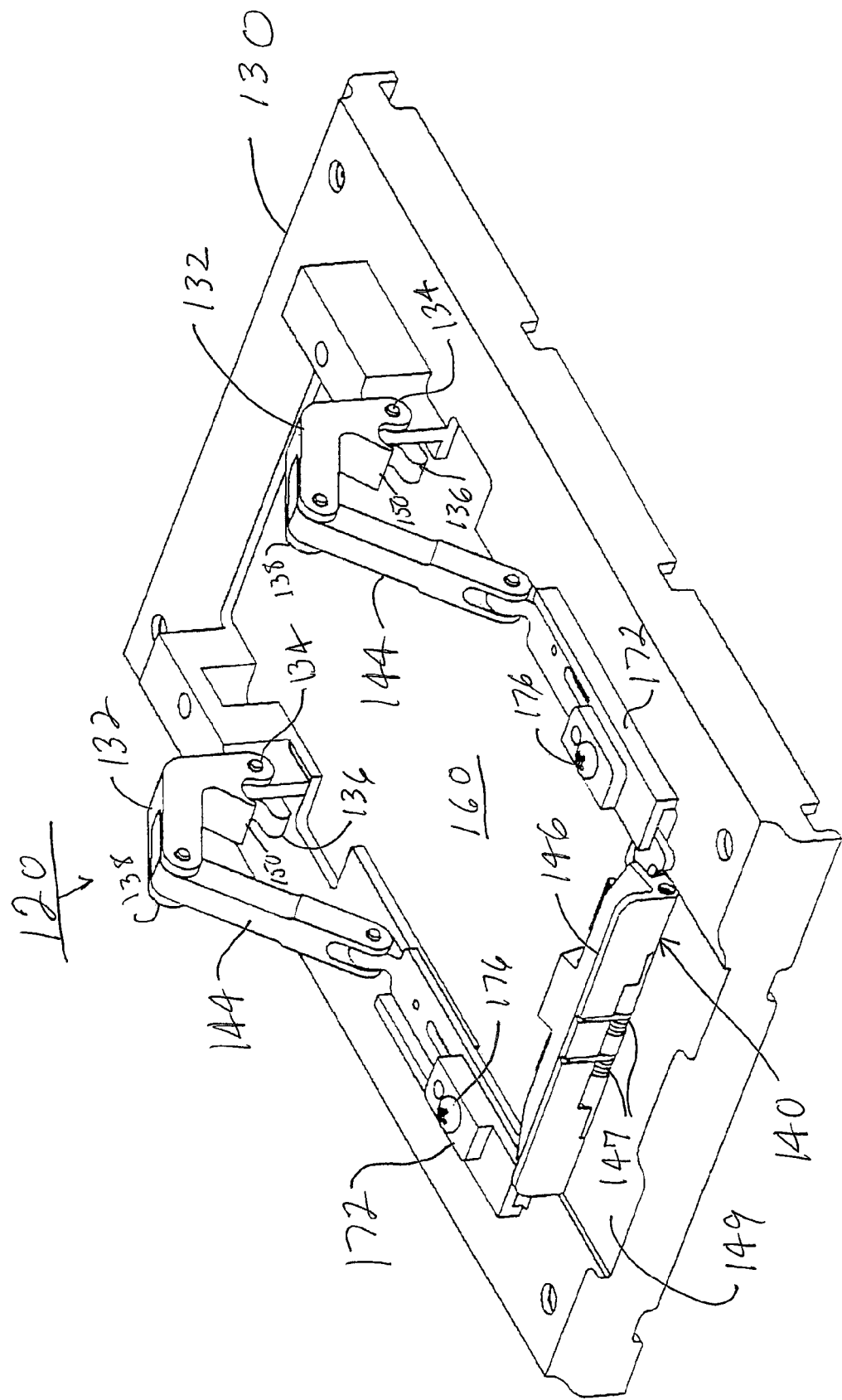
FIG. 14 is a perspective view of an alternative embodiment of an aircraft electronic display retention mechanism.
Figure 16:
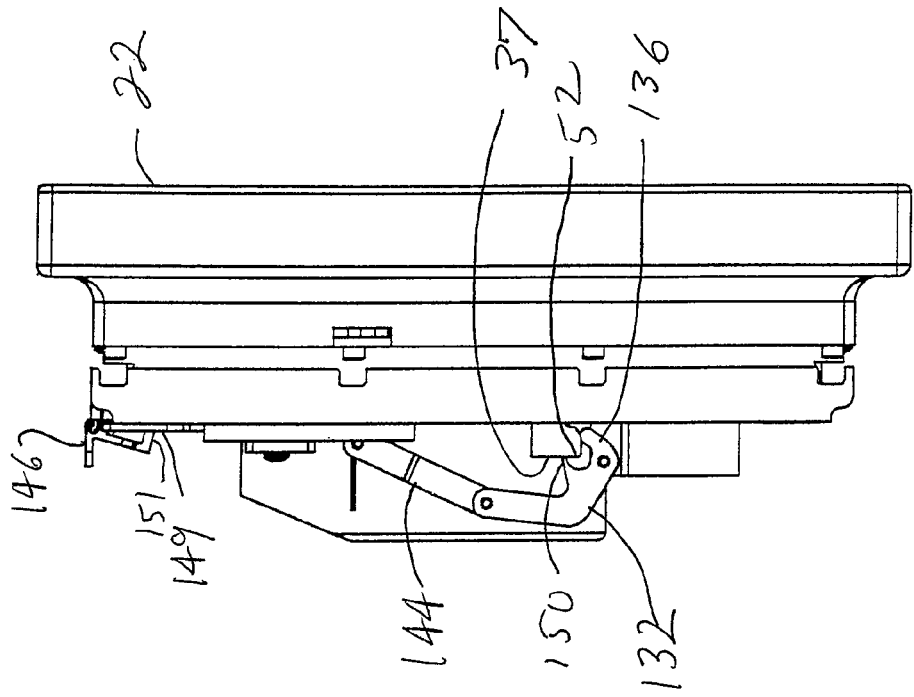
FIG. 16 is the same view as FIG. 15 showing the retention device ejecting the display device.
Figure 15:
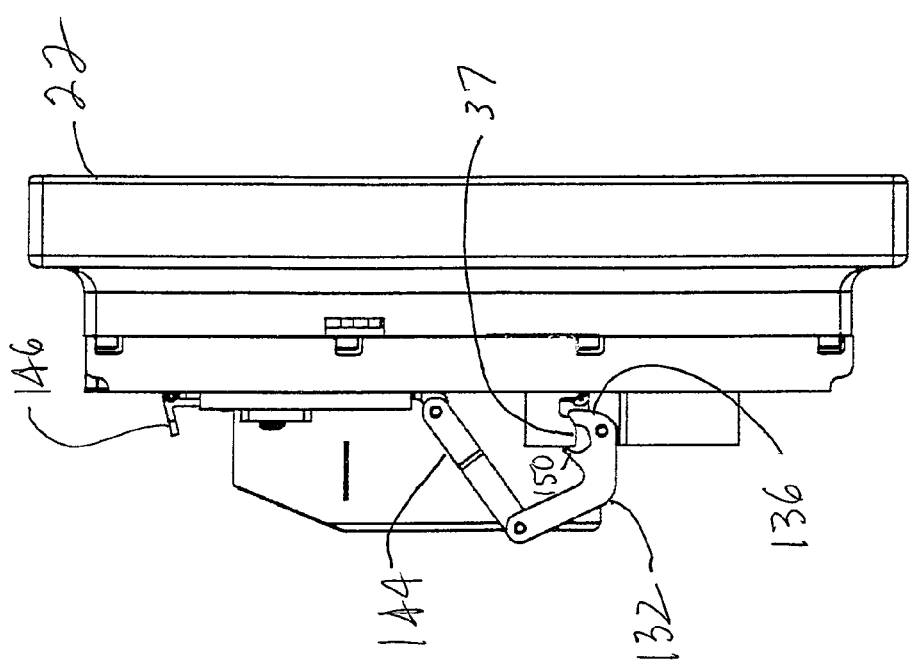
FIG. 15 is a side elevation of the retention mechanism in FIG. 14 showing the retention mechanism latching the display device.

An alternative embodiment of a retention mechanism 120 includes one or more levers 132 that are each mounted by a pivot 134 to base 130 (FIGS. 14-16). Two such levers are illustrated on opposite sides of an opening 160. Each lever 132 is pivotally mounted to base 130 at a pivot 134 and has an engaging portion 136 on one side of pivot 134 that is configured to engage and retain engaged portion 37 of electronic device 22. Each lever 132 also has an actuation portion 138 on an opposite side of pivot 134 that is configured to rotate the respective lever 132 about its pivot 134 between a first orientation and a second orientation. In the first orientation, in which the portion of lever 132 adjacent pivot 134 is generally horizontal, such as illustrated in FIG. 15, engaging portion 136 retains engaged portion 37. In the second orientation shown in FIG. 16, in which the portion of lever 132 adjacent pivot 134 is at its maximum upward slope, engaging portion 136 does not retain engaged portion 37. Electronic device 22 is free of retention mechanism 120.

Retention mechanism 120 also includes a manual actuator 140. Manual actuator 140 is connected with actuation portion 138 of each lever 132 in a manner that as manual actuator 140 moves in a linear motion between a second, raised, position illustrated in FIG. 16 and a first, lowered, position illustrated in FIG. 15, it rotates levers 132. In particular, manual actuator 140 rotates each lever 132 to its first, generally horizontal, orientation illustrated in FIG. 15 when the manual actuator is moved to its first position and rotates each lever 132 to its second, more upward sloping orientation illustrated in FIG. 16 when manual actuator 140 is moved to its second elevated position. Manual actuator 140 has two parallel elongated members (not visible in FIGS. 14-16) that guide its linear motion by engaging guide blocks 172. Each elongated member is limited in its range of travel by a slot engaged by stationary pins 176.

In addition to rotating levers 132, manual actuator 140 provides a second point of retention of electronic device 122. In particular, manual actuator 140 has an engaging portion that engages an engaged portion of electronic device 22 to further retain the electronic device to base 130. In the illustrated embodiment, the engaging portion and engaged portion form a tongue and groove joint, but other configurations are possible. Manual actuator 140 is generally in the shape of a horseshoe with the two elongated members joined with levers 132 by respective links 144. Links 144 translate the linear movement of manual actuator 140 to the rotary motion of levers 132. Manual actuator 140 further includes a user grasp member 146 that is configured for engagement by a user to move the manual actuator between the first and second positions. Grasp member 146 is pivotally mounted and spring biased by torsion springs 247. When manual actuator 140 is in its lowered position shown in FIG. 15, springs 247 cause lip 151 to engage an edge of a recessed surface 149 of base 130 thus maintaining the manual actuator 140 in its lowered position that engages the electronic display device 22. When the user lifts up on grasp member 146, it pivots against the bias of springs 147 which withdraws lip 151 from the edge of surface 149 allowing manual actuator 140 to be raised thus disengaging the manual actuator from the electronic display device 22. Thus, the spring biased pivotal mounting of grasp member 146 provides a form of lock that keeps the electronic display device retained by the retention mechanism unless a user applies a motion to the manual actuator to release the electronic display device from the retention mechanism. This is especially useful in an avionic setting to prevent aircraft vibration from inadvertently disengaging the electronic display device.

For each lever 132, pivot 134 is closer to engaging portion 136 than to actuation portion 138. In this manner, mechanical leverage is attained, and force applied to engaged portion 37 is greater than force applied to actuation portion 138. Engaging portion 136 includes a first extension 148 that is configured to pull engaged portion 37 into engagement with base 130 as levers 132 pivot between the second, more vertical, orientation and said first, generally horizontal, orientation. Engaging portion 136 includes a second extension 150 that is configured to push engaged portion 37 away from base 130 as levers 132 pivot between the first, generally horizontal, orientation and the second, more vertical, orientation. When engaged by engaging portion 136 of lever 132, protrusion 52 of engaged portion 37 is positioned between first and second extensions 148, 150 such that first extension 148 moves protrusion 52 in one direction as lever 132 pivots from the second orientation to the first orientation and second extension 150 moves protrusion 52 in an opposite direction as lever 132 pivots from the first orientation to the second orientation. Thus, levers 132 latch engaged portion 37 to base 130 and pull electrical contacts 24, 26 together as levers 132 are rotated to the generally horizontal orientation illustrated in FIG. 15. Levers 132 also provide leveraged force pushing the electrical contacts 24, 26 apart as levers 132 are rotated to a more vertical orientation illustrated in FIG. 16. This assists in producing the large force needed to connect and disconnect electrical contacts 24, 26, which may require as great as 30 pounds of force, as an example. In other respects, retention mechanism 120 operates in the same manner as retention mechanism 20.

Figure 18:
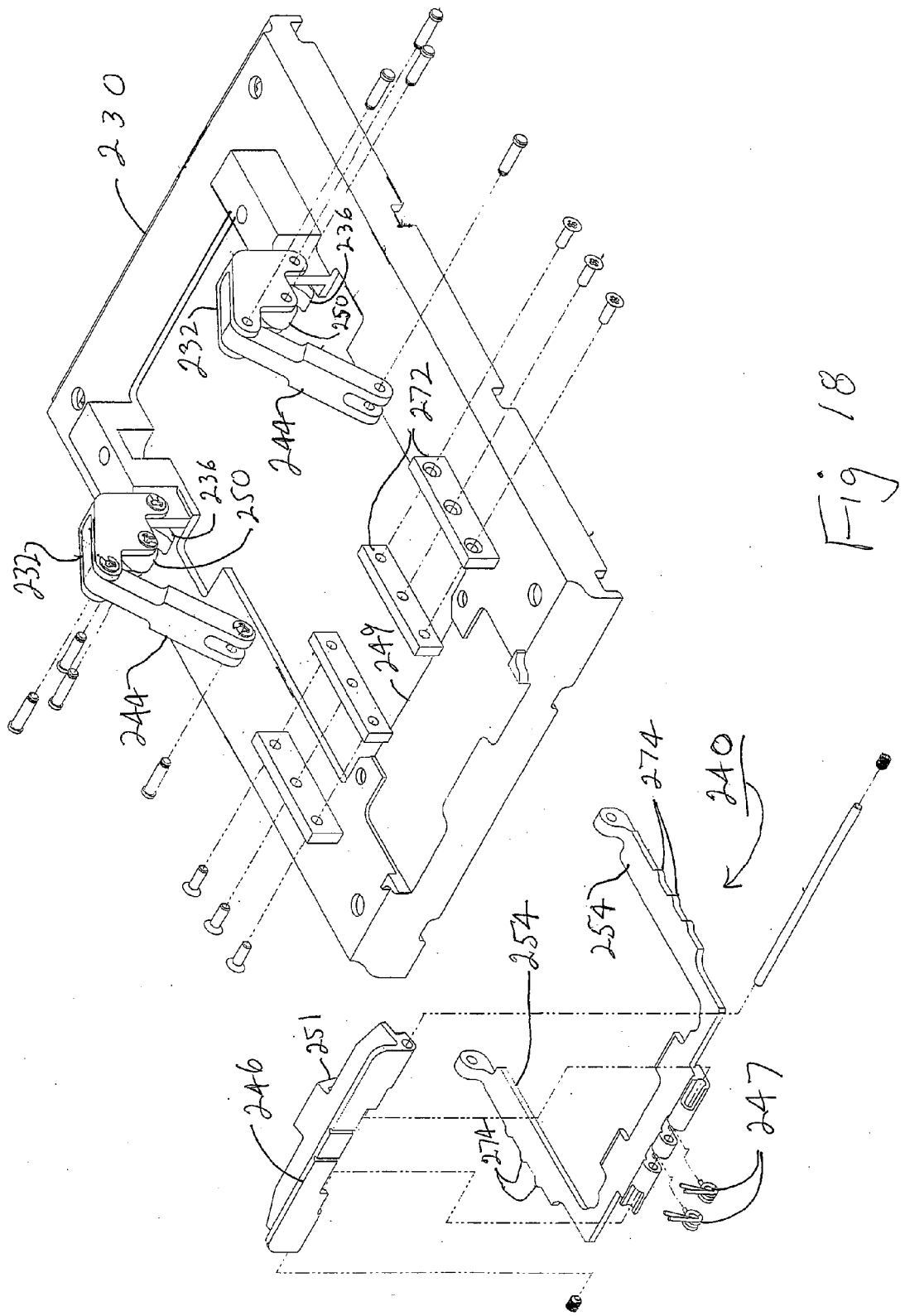
FIG. 18 is an exploded perspective view of the retention mechanism in FIG. 17.

In yet an additional embodiment, a retention mechanism 220 includes one or more levers 232 that are each mounted by a pivot 234 to a base 230 (FIGS. 17 and 18). Two such levers are illustrated on opposite sides of opening 260. Each lever 232 is pivotally mounted to base 230 at a pivot 234 and has an engaging portion 236 on one side of pivot 234 that is configured to engage and retain an engaged portion 37 of electronic device 22. Each lever 232 also has an actuation portion 238 on an opposite side of pivot 234 that is configured to rotate the respective lever 232 about its pivot 234 between a first orientation and a second orientation. In this regard, retention mechanism operates in a similar manner to retention mechanisms 20, 120. An engaging portion 236 of lever 232 includes a first extension 248 that is configured to pull engaged portion 37 into engagement with base 230 as levers 232 pivot between the second, more vertical, orientation and said first, generally horizontal, orientation. Engaging portion 236 includes a second extension 250 that is configured to push engaged portion 37 away from base 230 as levers 232 pivot between the first, generally horizontal, orientation and the second, more vertical, orientation. Second extensions 250 are free wheeling rollers. This reduces friction upon extensions 250 pushing against portion 37.

Retention mechanism 220 also includes a manual actuator 240. Manual actuator 240 is connected with actuation portion 238 of each lever 232 through links 244. In this manner, as manual actuator 240 moves in a linear motion between a second, raised position and a first, lowered, position, it rotates levers 232. Manual actuator 240 has two parallel elongated members 254 that guide its linear motion by engaging guide blocks 272. Each elongated member 254 is limited in its range of travel by a pair of stationary stops 276, only one of which can be seen in FIG. 17. Elongated members 254 include serrated edges 274 in order to reduce sliding friction along blocks 272 because of reduced surface contact between edges 274 and blocks 272.

In addition to rotating levers 232, manual actuator 240 provides a second point of retention of electronic device 22 in the same general manner as manual actuator 40, 140. Manual actuator 240 further includes a user grasp area 246 between elongated members 254 that is configured for engagement by a user to move the manual actuator between the first and second positions. Grasp area 246 has the same general structure and operation as grasp area 146, including a lip 251 that engages an edge of a recessed surface 249 of base 230 and spring biases 247 to bias lip 251 in a lock position.

While the foregoing description describes several embodiments of the present invention, it will be understood by those skilled in the art that variations and modifications to these embodiments may be made without departing from the spirit and scope of the invention, as defined in the claims below. The present invention encompasses all combinations of various embodiments or aspects of the invention described herein. It is understood that any and all embodiments of the present invention may be taken in conjunction with any other embodiment to describe additional embodiments of the present invention. Furthermore, any elements of an embodiment may be combined with any and all other elements of any of the embodiments to describe additional embodiments.

The embodiments of the invention in which an exclusive property or privilege is claimed are defined as follows:

1. An aircraft electronic device retention mechanism that is adapted to removeably support an electronic device having a surface, a first engaged portion and a second engaged portion within a cockpit, said electronic device retention mechanism comprising:
   a base having a first surface that is configured to interface with the surface of the electronic device;
   at least one lever that is mounted by a pivot to said base, said at least one lever having an engaging portion that is adapted to apply a force to the first engaged portion of the electronic device to retain the electronic device and an actuation portion that is adapted to rotate said lever about said pivot between a first orientation in which said engaging portion applies the force to retain the first engaged portion and a second orientation in which said engaging portion does not apply the force to retain the first engaged portion; and
   a manual actuator connected with said actuation portion of said pivot, said manual actuator being configured to move between a first position which rotates said at least one lever to said first orientation and a second position which rotates said at least one lever to said second orientation wherein said base has a second surface that is opposite said first surface, and at least one opening between said first and second surfaces, wherein said at least one lever and said manual actuator are at said second surface and said at least one lever engages the first engaged portion of the electronic device through said at least one opening.

2. The electronic device retention mechanism as claimed in claim 1 wherein said manual actuator is configured to linear motion between said first and second positions.

3. The electronic device retention mechanism as claimed in claim 2 including a link between said manual actuator and said at least one lever, said link adapted to translate linear motion of said manual actuator to rotational motion of said at least one lever.

4. The electronic device retention mechanism as claimed in claim 1 wherein said manual actuator includes a user grasp area that is configured for engagement by a user to move between said first and second positions.

5. The electronic device retention mechanism as claimed in claim 4 wherein said grasp area is mounted to said manual actuator to move between a lock position which locks said manual actuator in said first position and an unlock position in response to being grasped by a user.

6. The electronic device retention mechanism as claimed in claim 1 wherein said manual actuator has another engaging portion comprising one of a tongue and groove that engages the second engaged portion of the electronic device wherein the second engaged portion comprises the other of said tongue and groove.

7. The electronic device retention mechanism as claimed in claim 1 wherein said pivot is closer to said engaging portion than to said actuation portion wherein force applied to the first engaged portion of the electronic device as a result of pivoting of said at least one lever is greater than force applied to said actuation portion in order to pivot said at least one lever.

8. The electronic device retention mechanism as claimed in claim 1 wherein said engaging portion includes a first extension that is adapted to apply the force to pull said first engaged portion into engagement with said base as said at least one lever pivots between said second orientation and said first orientation and a second extension that is adapted to apply another force to push said first engaged portion away from said base as said at least one lever pivots between said first orientation and said second orientation.

9. The electronic device retention mechanism as claimed in claim 8 wherein said second extension comprises a roller.

10. The electronic device retention mechanism as claimed in claim 8 for use with an electronic device wherein the first engaged portion includes a protrusion of the electronic device that is positioned between said first and second extensions when the electronic device is at said base, wherein said first extension moves the protrusion in one direction as said at least one lever pivots from said second orientation to said first orientation and wherein said second extension moves the protrusion in an opposite direction as said at least one lever pivots from said first orientation to said second orientation.

11. The electronic device retention mechanism as claimed in claim 1 for use with an electronic device having first electrical contacts that extend beyond said electronic device surface, said electronic device retention mechanism including second electrical contacts that are compatible with said first electrical contacts and said first electrical contacts extend through said at least one opening when said electronic device is positioned at said first surface and wherein the second electrical contacts engage the first electrical contacts when the first engaged portion of the electronic device is retained to the base and wherein said at least one lever is positioned where the first electrical contacts pass through said at least one opening.

12. An aircraft electronic device retention mechanism that is adapted to removeably support an electronic device having a surface, a first engaged portion and a second engaged portion within a cockpit, said electronic device retention mechanism comprising:
 a base having a surface that is configured to interface with the surface of the electronic device;
 at least two levers that are each mounted by a pivot to said base, said levers each having an engaging portion that is adapted to apply a force to the first engaged portion of the electronic device to retain the electronic device and an actuation portion that is adapted to rotate said lever about said pivot between a first orientation in which said engaging portion applies the force to retain the engaged portion and a second orientation in which said engaging portion does not apply the force to retain the engaged portion; and
 a manual actuator including at least two elongated members and at least two links, each between one of said elongated members and one of said levers, wherein said manual actuator is configured to linear motion between said first and second positions, said links adapted to translating linear motion of said manual actuator to rotational motion of said at least two levers, said manual actuator being configured to move between said first position which rotates said at least two levers to said first orientation and said second position which rotates said at least two levers to said second orientation, wherein said manual actuator is adapted to retain the second engaged portion of the electronic device when in said first position and not retain the second engaged portion when in said second position.

13. The electronic device retention mechanism as claimed in claim 12 wherein said manual actuator includes a user grasp area that is configured for engagement by a user to move between said first and second positions.

14. The electronic device retention mechanism as claimed in claim 13 wherein said grasp area is mounted to said manual actuator to move between a lock position which locks said manual actuator in said first position and an unlock position in response to being grasped by a user.

15. The electronic device retention mechanism as claimed in claim 12 wherein said manual actuator has an engaging portion comprising one of a tongue and groove that engages the second engaged portion of the electronic device wherein the second engaged portion comprises the other of said tongue and groove.

16. The electronic device retention mechanism as claimed in claim 12 wherein said pivot is closer to said engaging portion than to said actuation portion wherein the force applied to the first engaged portion as a result of rotation of the respective one of said levers is greater than force applied to said actuation portion by the respective one of said links.

17. The electronic device retention mechanism as claimed in claim 12 wherein said engaging portion includes a first extension that is adapted to pull the first engaged portion into engagement with said base as said levers pivot between said second orientation and said first orientation and a second extension that is adapted to push the first engaged portion away from said base as said at least one lever pivots between said first orientation and said second orientation.

18. The electronic device retention mechanism as claimed in claim 17 wherein said second extension comprises a roller.

19. The electronic device retention mechanism as claimed in claim 17 for use with an electronic device wherein the first engaged portion includes a protrusion of the electronic device that is positioned between said first and second extensions when the electronic device is at said base, wherein said first extension moves said protrusion in one direction as said levers pivot from said second orientation to said first orientation and wherein said second extension moves said protrusion in an opposite direction as said levers pivot from said first orientation to said second orientation.

20. The electronic device retention mechanism as claimed in claim 12 wherein said base has a second surface that is opposite said first surface, and at least one opening between said first and second surfaces, wherein said levers and said manual actuator are at said second surface and said levers engage the first engaged portion through said at least one opening.

21. The electronic device retention mechanism as claimed in claim 20 for use with an electronic device having first electrical contacts extending from said electronic device surface at the first engaged portion, said electronic device retention mechanism having second electrical contacts that are compatible with the first electrical contacts wherein said first electrical contacts extend through said at least one opening and engage said second electrical contacts when said electronic device is positioned at said first surface and said levers are positioned where said first electrical contacts pass through said at least one opening.

22. A method of removeably supporting an aircraft electronic device having a surface, a first engaged portion and a second engaged portion within a cockpit, said method comprising:
 positioning the electronic device on a base that is generally configured to the size and shape of the surface of the electronic device and having at least one lever mounted by a pivot to said base and a manual actuator on said base, said at least one lever having an engaging portion that is adapted to engage the first engaged portion of the electronic device and an actuation portion that is adapted to rotate said at least one lever about said pivot between a first orientation in which said engaging portion retains the engaged portion and a second orientation in which said engaging portion does not retain the engaged portion, said manual actuator connected with said opposite side of said pivot and being configured to move between a first position which rotates said at least one lever to said first orientation and a second position which rotates said at least one lever to said second orientation; and manually moving said manual actuator from said second position to said first position and thereby rotating said at least one lever from said second orientation to said first orientation thereby retaining said engaged portion of the electronic device wherein said base has a first surface that is adapted to interface with the surface of the electronic device, a second surface that is opposite said first surface, and at least one opening between said first and second surfaces, wherein said at least one lever and said manual actuator are at said second surface and said at least one lever engages the first engaged portion through said at least one opening.

23. The method as claimed in claim 22 wherein said manual actuator is adapted to retain the second engaged portion of the electronic device when in said first position and not retain the second engaged portion of the electronic device when in said second position wherein said manually moving said manual actuator from said second position to said first position includes retaining the second engaged portion of the electronic device.

24. The method as claimed in claim 22 including at least one link between said manual actuator and said at least one lever and wherein said manually moving said manual actuator includes applying a linear motion to said manual actuator.

\* \* \* \* \*